United States Patent [19]

Arimoto et al.

[11] Patent Number: 5,084,746
[45] Date of Patent: Jan. 28, 1992

[54] SEMICONDUCTOR MEMORY DEVICE

[75] Inventors: Kazutami Arimoto; Koichiro Mashiko; Kiyohiro Furutani, all of Hyogo, Japan

[73] Assignee: Mitsubishi Denki Kabushiki Kaisha, Tokyo, Japan

[21] Appl. No.: 511,909

[22] Filed: Apr. 24, 1990

Related U.S. Application Data

[63] Continuation of Ser. No. 287,662, Dec. 20, 1988, abandoned, which is a continuation of Ser. No. 11,434, Jan. 29, 1987, abandoned.

[30] Foreign Application Priority Data

Jan. 30, 1986 [JP] Japan ................................ 61-20615

[51] Int. Cl.$^5$ ...................... H01L 29/68; H01L 29/06; H01L 27/02
[52] U.S. Cl. ................................ 357/23.6; 357/23.11; 357/51; 357/55
[58] Field of Search ...................... 357/23.6, 23.11, 51, 357/55

[56] References Cited

U.S. PATENT DOCUMENTS

| | | |
|---|---|---|
| 4,044,340 | 8/1977 | Itoh . |
| 4,197,554 | 4/1980 | Meusburger . |
| 4,476,547 | 10/1984 | Miyasaka ............................ 357/23.6 |
| 4,493,056 | 1/1985 | Mao .................................... 357/23.6 |
| 4,717,942 | 1/1988 | Nakamura et al. ................ 357/23.6 |
| 4,763,178 | 8/1988 | Sakui et al. ........................ 357/23.6 |

FOREIGN PATENT DOCUMENTS

| | | |
|---|---|---|
| 0181162 | 10/1985 | European Pat. Off. . |
| 59-104156 | 6/1984 | Japan . |
| 60-113460 | 6/1985 | Japan ................................ 357/23.6 |
| 60-136367 | 7/1985 | Japan ................................ 357/23.6 |
| 61-140169 | 6/1986 | Japan ................................ 357/23.6 |

OTHER PUBLICATIONS

"A New Memory Cell Layout Method for High Density Drams" IECE Japan, 1986 National Conference, Lecture No. 499.
"A 1Mb DRAM with a Folded Capacitor Cell Structure", Fumio Horiguchi et al., ISSCC85 Digest of Technical Papers, Feb. 1985, pp. 244–245.
1 Mb DRAM with a Folded Capacitor Cell Structure, *IEEE International Solid-State Circuits Conference*, Feb. 1985, pp. 244, 245, 355.

Primary Examiner—Andrew J. James
Assistant Examiner—Ngan Van Ngo
Attorney, Agent, or Firm—Lowe, Price, LeBlanc & Becker

[57] ABSTRACT

A semiconductor memory device having a folded bit line structure (16a, 16b), in which a field oxide film (2) is formed on both sides of a channel region (11) of a transfer gate, a groove isolation region 12 for defining a memory cell region is formed to surround the field oxide film 2, and the side walls of the groove isolation region 12 include a memory cell utilized as a capacitor for storing charges as information.

16 Claims, 5 Drawing Sheets

SEMICONDUCTOR MEMORY DEVICE

This application is a continuation of application Ser. No. 07/287,662, filed on Dec. 20, 1988, which is a continuation of Ser. NO. 07/011,434, filed Jan. 29, 1987 both now abandoned.

BACKGROUND OF THE INVENTION

1. Field of the Invention

The present invention relates to a semiconductor memory device, and more particularly, it relates to a memory cell structure in a semiconductor memory device with a folded bit line structure suitable for high integration.

2. Description of the Prior Art

Conventionally, various memory cell structures have been proposed and put into practice for achieving high integration of a semiconductor memory device. For example, a memory cell structure is known in which adjacent memory cells are isolated by a groove region and the side walls of the groove region are utilized as a capacitor for storing information.

FIGS. 1A and 1B are diagrams showing a structure of a conventional highly integrated dynamic semiconductor memory device, where FIG. 1A is a top sectional view thereof, and FIG. 1B is a cross sectional view taken along a line X—X' in FIG. 1A. The conventional dynamic memory device as shown is disclosed in an article by F. Horiguchi et al., entitled "1 Mb DRAM with Folded Capacitor Cell Structure", ISSCC85 Digest of Technical Papers, Feb., 1985, pp. 244–245.

A memory cell comprises a capacitor portion $C_S$ for storing information in the form of charges and a transfer gate portion TR for transferring information to and from the capacitor portion $C_S$. A groove isolation region 12 is formed around the memory cell. The groove region 12 is filled with a field oxide 2 serving as an insulator. Adjacent cells are electrically isolated by the field oxide 2.

The transfer gate portion TR comprises n+-type diffusion regions 5a and 5b formed in a predetermined region of the p-type semiconductor substrate 1 and serving as a source and a drain, and a second polysilicon (polycristalline silicon) layer 7 formed on the p+-type semiconductor substrate 1 between the diffusion regions 5a and 5b through a thin insulator film (gate dielectric film) and serving as a gate electrode.

The capacitor portion $C_S$ comprises a first polysilicon layer 3 serving as a cell plate of one electrode, the N+-type diffusion region 5b serving as the other electrode, and a capacitor dielectric film 4 serving as a dielectric between these layers. The diffusion region 5b is also formed in the portion along the side walls of the groove 12. The first polysilicon layer 3 is formed so as to extend over and beyond the groove 12. Thus, the capacitor portion $C_S$ comprises capacitance $C_F$ formed of the diffusion region 5b and the first polysilicon layer 3 in a flat portion, and capacitance $C_P$ formed of the diffusion region 5b and the first polysilicon layer 3 on the side walls of the groove isolation region 12.

The N+-type diffusion region 5a of the transfer gate TR is connected to a first aluminum interconnection layer 6 serving as a bit line through a contact hole 10. The gate electrode for turning the transfer gate TR on/off serves as a part of a word line 9. The word line 9 comprises the second polysilicon layer 7 and the second aluminum interconnection layer 8. The second polysilicon layer 7 and the second aluminum interconnection layer 8 are electrically connected at every constant distance, whereby the word line 9 is reduced in resistance.

In the foregoing, since the side walls of the groove isolation region 12 provided along the outer peripheral portion of the memory cell are utilized as capacitance $C_P$, sufficiently wide operating margin and sufficient alpha particle immunity are ensured due to capacitance $C_P$, even if the chip area and the cell size are reduced so that capacitance $C_S$ in the flat portion is reduced. The longer the peripheral length of the memory cell to be utilized is, the shallower the groove for obtaining the same quantity of capacitance $C_P$ can be.

A folded bit line structure has been proposed for high integration of a memory device.

FIGS. 2A and 2B are diagrams showing a structure of a memory cell which comprises a combination of a memory cell structure utilizing the side walls of the groove isolation region as capacitance and a folded bit line structure, where FIG. 2A is a plan view thereof and FIG. 2B is a cross sectional view taken along a line Y—Y' in FIG. 2A. Portions corresponding to those in FIGS. 1A and 1B have the same reference numerals in FIGS. 2A and 2B. In this structure, bit lines 6a and 6b comprising the first aluminum interconnection layer constitute a pair of complementary bit lines. The groove isolataion region 12 is formed on both sides of a channel region 11 of the transfer gate TR, whereby the channel region 11 is isolated from a capacitor portion of an adjacent memory cell. The first polysilicon layer 3 serving as a cell plate extends into the groove isolation region 12.

FIG. 3 is an enlarged cross sectional view in the neighborhood of the groove isolation region in FIG. 2A. As obvious from FIG. 3, the channel region 11 of the transfer gate TR is isolated from the capacitor portion o an adjacent memory cell by the groove isolation region 12. However, since a p-type diffusion layer serving as a channel stopper is not formed on the semiconductor substrate 1 in the groove isolation region 12, an inversion layer is liable to be formed in this portion. As a result, the leak current flows from an edge portion A of the channel region 11 through the inversion layer. In addition, the first polysilicon layer 3 serving as a cell plate must be terminated within the groove isolation region 12. Thus, if the groove isolation region 12 is formed with the minimum pattern width, it is difficult to perform an etching so as to terminate the first polysilicon layer 3 within the isolation region 12. Furthermore, since the channel region 11 is in contact with the groove region 12, the step in this portion is increased, so that it becomes difficult to pattern the second polysilicon layer 7 serving as a word line and being formed to extend over and beyond the channel region 11 and the groove isolation region 12. In order to avoid this, it is necessary to improve the process for filling the groove isolation region 12 with an insulator.

SUMMARY OF THE INVENTION

An object of the present invention is to solve the above described problems of the prior art and to provide a semiconductor memory device in which etching of a first polysilicon layer serving as a cell plate is not required in a groove isolation region and the step in the region can be reduced so that a channel region of a transfer gate may not be in contact with the groove isolation region.

A semiconductor memory device according to the present invention has a folded bit line structure, in which a thick insulating film is provided on both sides of the channel region, and a capacitor for storing information comprising a flat capacitor portion and a capacitor portion on the side walls of the groove isolation region formed along the outer periphery of the flat capacitor portion is provided around the thick insulating film. Capacitors of adjacent memory cells are isolated by the groove isolation region. A first conductive layer serving as a cell plate is formed to extend over and beyond the groove isolation region, and is shared with the capacitor portions adjacent through the groove isolation region.

In this structure, since the first conductive layer serving as a cell plate need not terminate in the groove isolation region, patterning thereof is simplified. In addition, since a thick insulating film is formed on both sides of the channel region, it is possible to constrain the leak current in the channel region These objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1A:
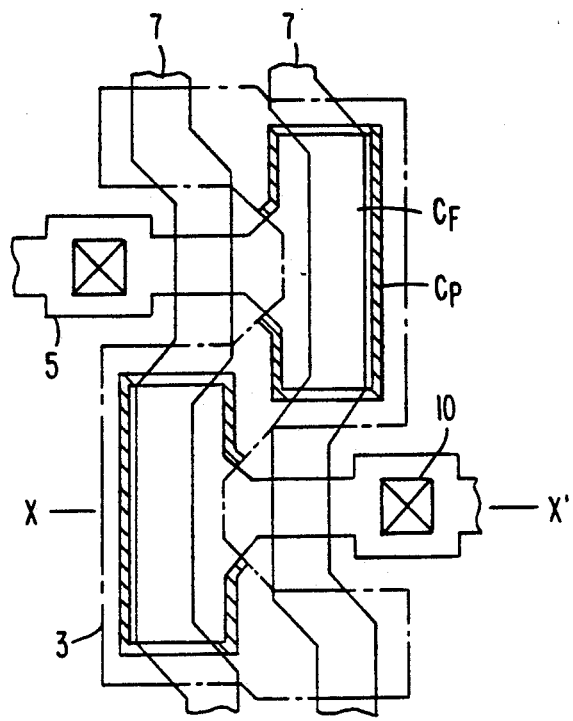
FIG. 1A is a plan view showing a structure of conventional semiconductor memory device.
Figure 1B:
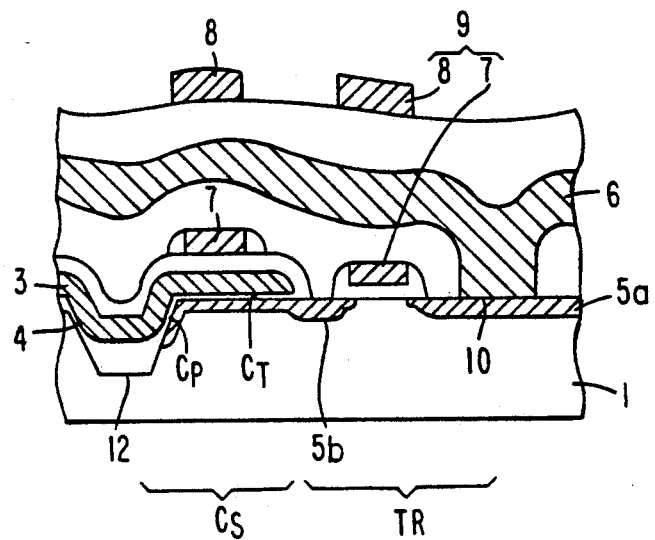
FIG. 1B is a cross sectional view taken along a line X—X' in FIG. 1A.
Figure 2A:
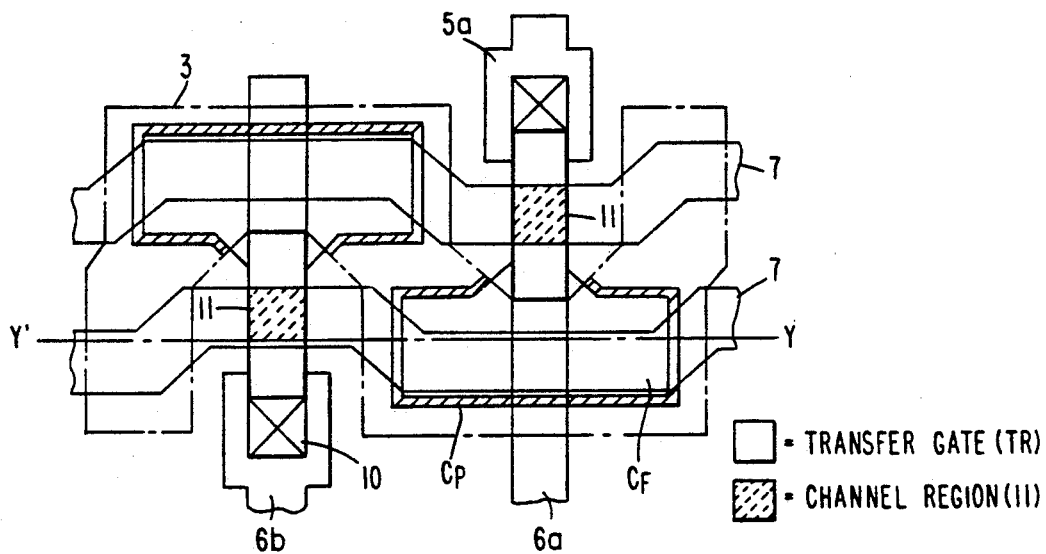
FIG. 2A is a plan view showing a structure of a conventional semiconductor memory device which has a combination of a folded bit line structure with a memory cell structure having a capacitor utilizing side walls of a groove isolation region.
Figure 2B:
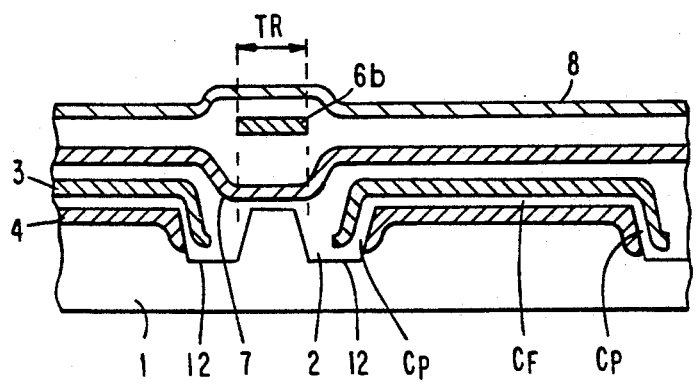
FIG. 2B is a cross sectional view taken along a line Y—Y' in FIG. 2A
Figure 3:
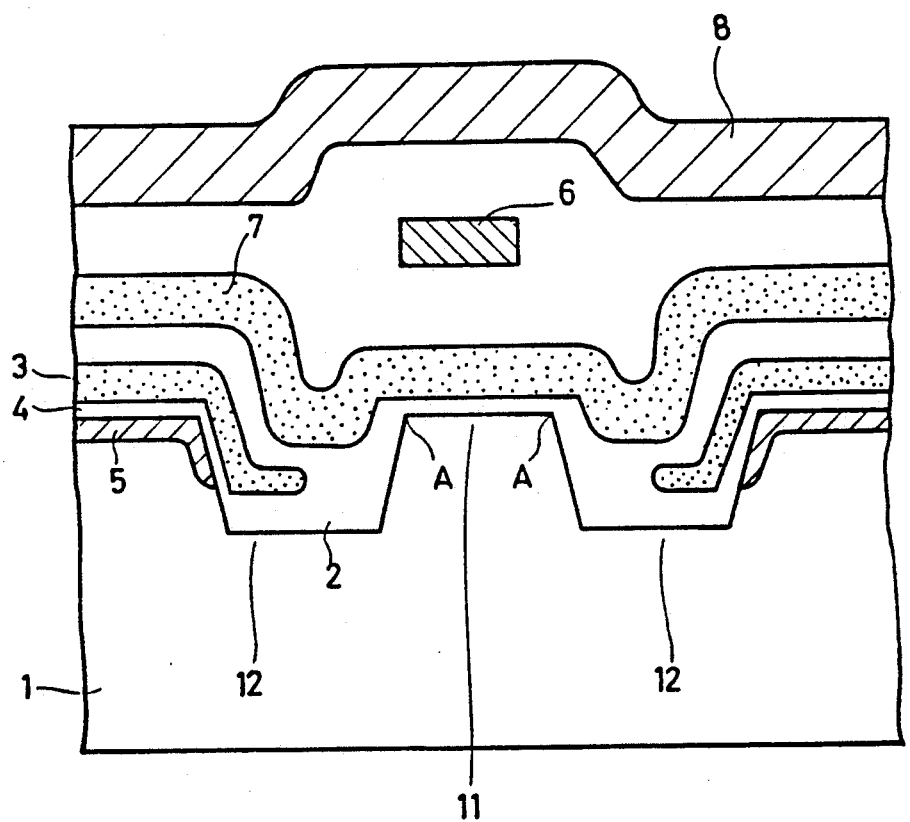
FIG. 3 is a partially enlarged view of FIG. 2B.
Figure 4A:
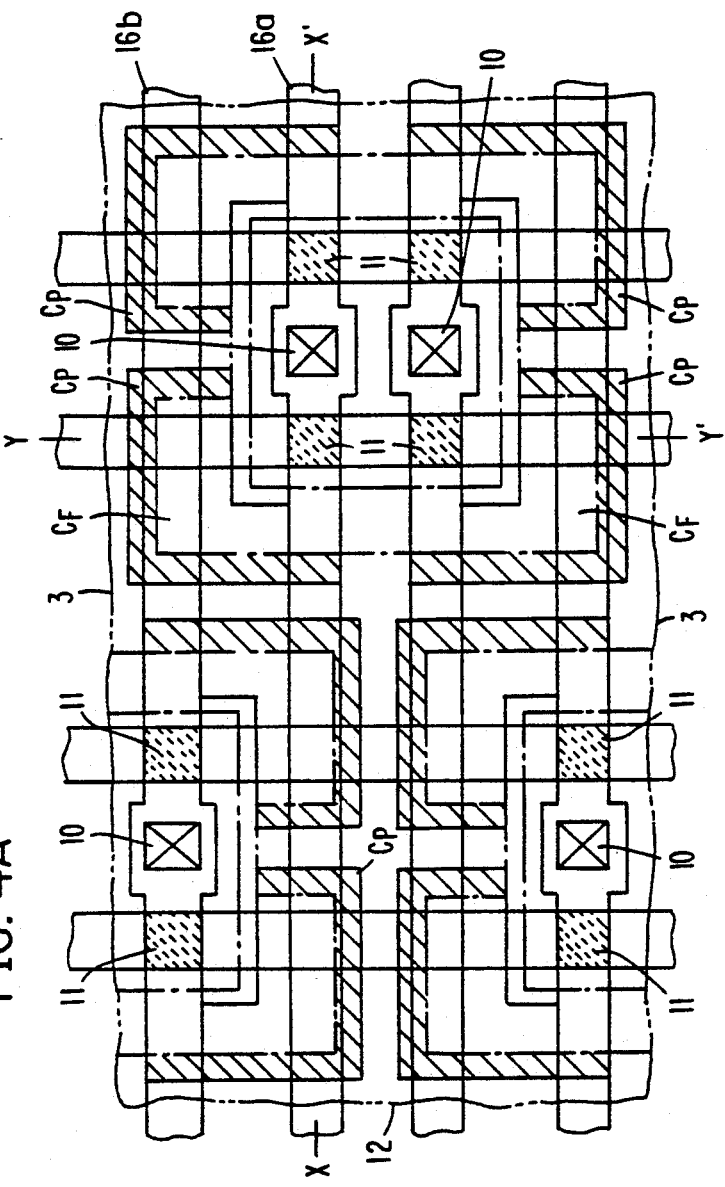
FIG. 4A is a plan view showing a structure of a semiconductor memory device according to an embodiment of the present invention.
Figure 4B:
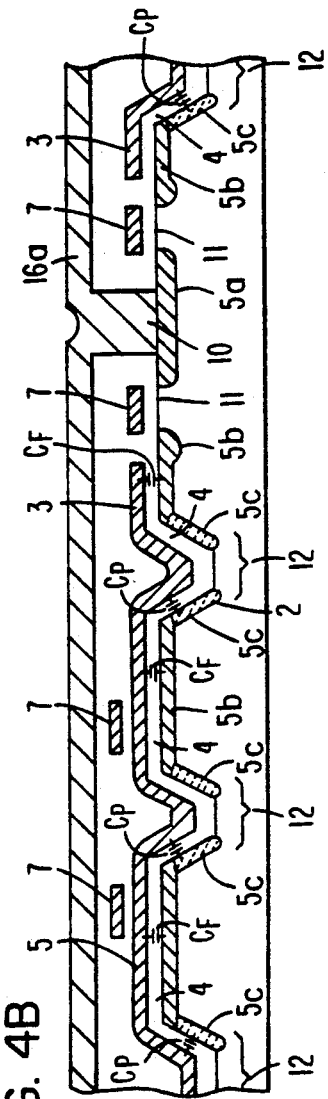
FIG. 4B is a cross sectional view taken along a line X—X' in FIG. 4A.
Figure 4C:
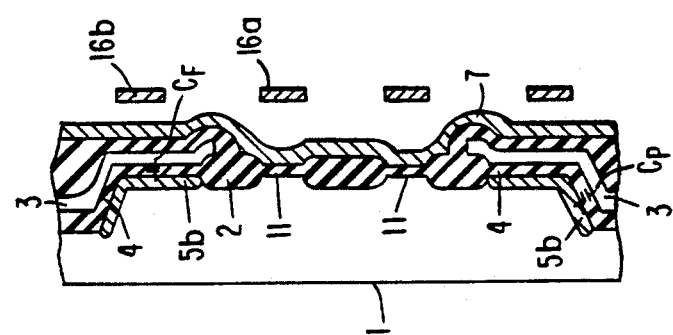
FIG. 4C is a cross sectional view taken along a line Y—Y' in FIG. 4A.

FIGS. 4A, 4B and 4C are diagrams showing a structure of a semiconductor memory device according to an embodiment of the present invention, where FIG. 4A is a plan view thereof, FIG. 4B is a cross sectional view taken along a line X—X' in FIG. 4A and FIG. 4C is a cross sectional view taken along a line Y—Y' in FIG. 4A. Referring now to FIGS. 4A to 4C, a structure of a semiconductor memory device according to an embodiment of the present invention is described. Portions identical or corresponding to those in FIG. 2A and 2B have identical reference numerals in FIGS. 4A to 4C.

A single memory cell is formed in an U shape, as shown in FIG. 4A. As shown in FIG. 4C, a field oxide film 2 of a thick oxide film is formed on both sides of a channel region 11 of a transfer gate, as seen in FIG. 4C. A channel region 11 and a capacitor portion $C_F$ are isolated by the field oxide film 2 (FIGS. 4A and 4C). Capacitors of memory cells connected to a first aluminum interconnection layer 16a (or 16b) serving as a bit line are isolated from each other by a groove isolation region 12, as seen in FIG. 4A. A first polysilicon layer 3 serving as a cell plate is formed to extend over and beyond the groove isolation region 12, and is shared with an adjacent memory cell. The first aluminum interconnection layer 16a (or 16b) serving as a bit line is connected to two memory cells through a contact hole 10. A pair of the first aluminum interconnection layers 16a and 16b constitute a pair of complementary bit lines.

As obvious from a plan view in FIG. 4A, according to a memory cell array structure of the semiconductor memory device of the present invention, the first polysilicon layer 3 serving as one electrode of a capacitor for storing charges as information can be shared with adjacent memory cells by extending through the groove isolation region 12 which separates the adjacent cells, and patterning (etching) is not required for terminating the first polysilicon layer 3 in the groove isolation region 12, whereby the manufacturing process is simplified.

In addition, since the groove isolation region 12 does not come into contact with the channel region 11, the channel region 11 does not have an edge shape, so that the leak current in a transistor is easily constrained and holding characteristics of charges as information is not deteriorated. Furthermore, the step in side ends of the channel region 11 is reduced, so that patterning of a second polysilicon layer 7 is simplified.

Furthermore, since this structure can make the best use of the side walls 5C of the groove isolation region 12, more capacitance for storing charges as information can be obtained, as compared with a conventional structure. For example, in order to obtain capacitance of 50fF if the 1 thickness of a capacitor insulating film is 100Å in design rule, the depth of the groove isolation region 12 may be approximately 2µm if the cell area is 10µm², so that the manufacturing process can be simplified.

Although in the above described embodiment, capacitor electrodes are formed of the first polysilicon layer 3 and an N⁺-type diffusion region 5b for a capacitor for storing charges as information, other combinations are possible. For example, if polysilicons are combined, a memory cell structure immune to radioactive rays such as alpha rays can be obtained.

Figure 5A:
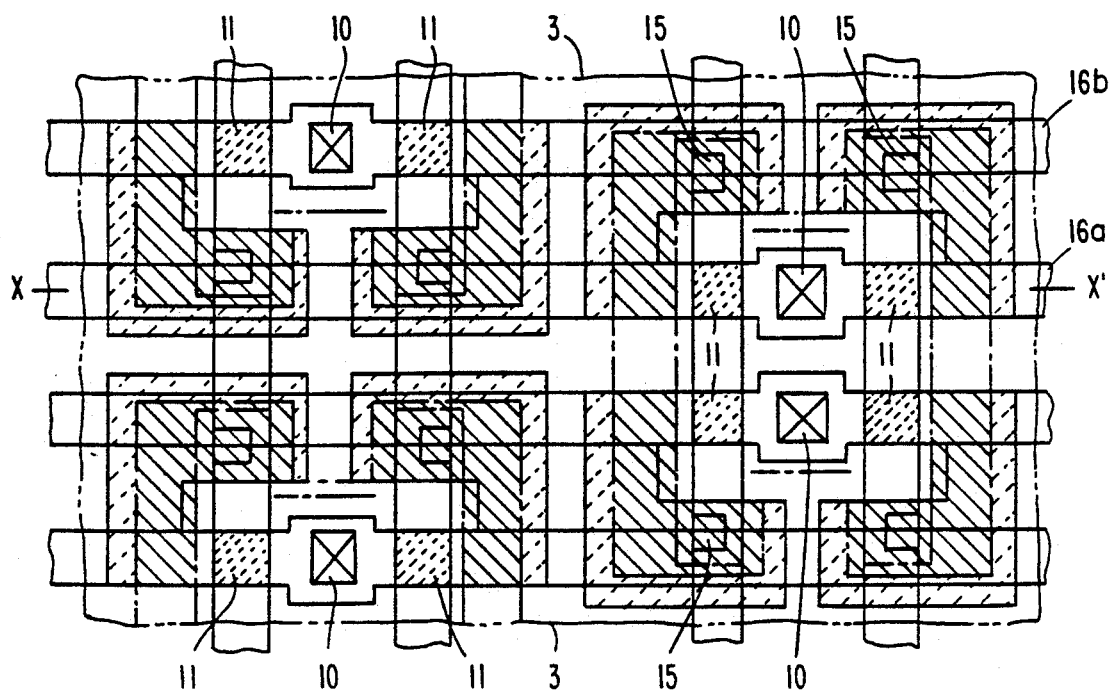
FIG. 5A is a plan view showing a structure of a semiconductor memory device according to another embodiment of the present invention.
Figure 5B:
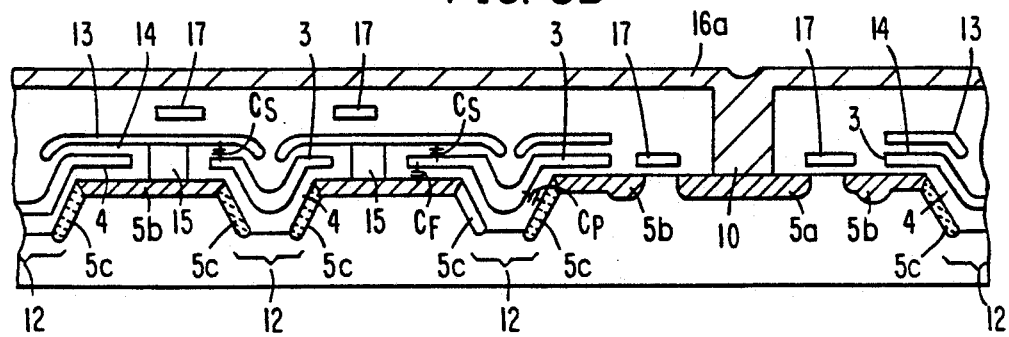
FIG. 5B is a cross sectional view taken along a line X—X' in FIG. 5A.

FIGS. 5A and 5B are diagrams showing a structure of a semiconductor memory device according to another embodiment of the present invention, where FIG. 5A is a plan view thereof, and FIG. 5B is a cross sectional view taken along a line X—X' in FIG. 5A. Portions identical or corresponding to those in FIGS. 4A and 4B have identical reference numerals in FIGS. 5A and 5B. In the structure shown in FIGS. 5A and 5B, a second polysilicon layer 13 is formed on the first polysilicon layer 3 through an insulating film 14 to overlap with the first polysilicon layer 3 at least in a flat (horizontal) region. The second polysilicon layer 13 is electrically connected to the N⁺-type diffusion region 5b directly through a contact 15. A third polysilicon layer 17 serving as a word line is provided to extend over and beyond the second polysilicon layer 13. The third polysilicon layer 17 constitutes a gate electrode of the transfer gate.

In the above described structure, additional capacitance $C_S$ is formed between the third polysilicon layer 13 and the first polysilicon layer 3. Thus, capacitance $C_S$ for storing charges as information comprising the first polysilicon layer 3 and the second polysilicon layer 13 is added to capacitance $C_P$ for storing charges as information comprising the first polysilicon layer 3 and the diffusion layer 5b, so that larger capacitance for storing charges as information can be obtained.

According to the present invention, since in a memory cell array with a folded bit line structure, a thick insulating film is formed on both sides of a channel region of a transfer gate of a memory cell, a groove isolation region is formed to surround the thick insulating film, and a capacitor for storing charges is formed on the side walls 5C of the groove isolation region, a first polysilicon layer serving as one electrode of a capacitor for storing charges as information need not be etched in the groove isolation region, so that the manufacturing process is simplified. In addition, the leak current in a channel region of a transistor is constrained to an extent of that in a normal LOCOS structure and further the step is reduced, so that reliabilty and yield of a semiconductor memory device are improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising a plurality of isolation merged capacitor trench type memory cells, said memory device having a folded bit line structure including a plurality of pairs of complementary bit lines each pair including two adjacent bit lines (16a, 16b), wherein only one it line in a pair is connected to a selected memory cell connected to a selected word line, each of said trench type memory cells including structure for preventing leakage current at an edge portion of a channel region, comprising:
a transfer gate formed on a semiconductor substrate and including a first impurity diffusion region (5a), a second impurity diffusion region (5b), and a channel region (11) formed between said first and second impurity diffusion regions (5a, 5b) said first impurity diffusion region electrically connected to a first bit line of a first bit line pair;
means for reducing said leakage current, including:
a thick insulating film (2) formed by selective oxidation of a surface of the substrate and provided at opposite sides of said channel region (11) for preventing flow of said leakage current, said sides of said channel region separated from said impurity diffusion regions (5a, 5b) by said thick insulating film;
a first capacitor ($C_F$) having a first electrode (5b) and a second electrode (3), said first electrode formed on the substrate surface, wherein said second impurity diffusion region (5b) comprises said fist electrode;
said first capacitor including a first region overlapped by a second bit line of the first bit line pair, a second region overlapped by the fist bit line of the first bit line pair and a third region connected with said first and second regions, and said first region having an end portion opposed to one end of said channel region and separated therefrom via said thick insulating film, and said second region having an end portion contacting said thick insulating film formed on another end of the channel region;
said end portion of said second region being isolated by said thick insulating film from a corresponding end portion o f a second region of a capacitor of an adjacent memory cell;
a groove isolation region (12) comprising side walls (5c) including a groove provided around said first capacitor ($C_F$) to define a trench isolation type memory cell;
said first capacitor ($C_F$) being connected to said channel region and substantially surrounded by said groove isolation region and said thick insulating film;
a first electrode of a second capacitor ($C_P$) formed along said side walls (5c) of said groove isolation region (12) and connected to said first electrode (5b) of said first capacitor; and
a second electrode of said second capacitor common to said second electrode (3) of said fist capacitor and extending over and beyond and the groove isolation region (12) so as to be shared therebetween.

2. A semiconductor memory devices as set forth in claim 1, wherein said second impurity diffusion region (5b) extends between adjacent trench isolation type memory cells, said second impurity diffusion region formed starting at a bottom edge of a groove isolation region (12) of a memory cell and extending to a bottom edge of another groove isolation region (12) of another memory cell.

3. A semiconductor device as set forth in claim 1, including a polysilicon layer forming said second electrode (3), said polysilicon layer extending from one memory cell to an adjacent memory cell through at lest one groove isolation region (12) therebetween.

4. A semiconductor device as set forth in claim 1, wherein said thick insulating film is approximately 100 Angstroms in thickness.

5. A semiconductor memory device in accordance with claim 1, wherein substantially flat portions of said thick insulating film are formed adjacent said side walls of said groove isolation region, said first capacitor ($C_F$) including said substantially flat portions of said thick insulating film as a dielectric thereof.

6. A semiconductor memory device comprising:
a plurality of bit lines arranged in pairs, each pair comprised of two adjacent bit lines receiving signals complementary to each other, said bit lines being substantially uniformly spaced from one another;
a plurality of word lines arranged substantially perpendicular to said plurality of bit lines;
a plurality of memory cells each respectively provided at respective intersections of said word lines with a respective one of said it likens of a pair, each memory cell including one transistor and one capacitor,
said transistor having a channel region and a thick LOCOS oxide film at opposite sides of said channel region for preventing formation of a parasitic transistor and for preventing flow of leakage current from a stage node of the memory cell to a bit line connected to the memory cell;
contact points between a first memory cell and a first it line of a fist pair and between a second memory cell and a second a it line in a second pair being aligned in a first line parallel to said word lines, wherein said second it lien is adjacent to said first bit line and said second pair is adjacent to said first pair, and connect points between a third memory cell and a further bit line of the fist pair and between a fourth memory cell and another bit line in the second pair being aligned in a second line parallel to said word lines, wherein said another bit line is non-adjacent to the first bit lines;

said one capacitor having a U-shaped planar layout, including a first capacitor region connected to an associated memory cell transistor and extending in parallel with and overlapped by a bit line of a predetermined pair to which the associated memory cell transistor is connected via a contact hole, a second capacitor region separated from said associated memory cell transistor extending in parallel with and overlapped by the other bit line of said predetermined pair, and a third capacitor region connecting said first and second capacitor regions.

7. A memory device according to claim 6, wherein said transistor included in each said memory cell comprises a source region connected to a bit line, a drain region connected to one electrode of the capacitor in said cell, and a channel region between the source and drain regions, and wherein a thick dielectric film is formed between respective channel regions of adjacent memory cells aligned on the first line, thereby electrically separating the channel regions of the adjacent memory cells from each other.

8. A memory device according to claim 6, wherein a trench is provided between respective one electrodes of the capacitors of memory cells aligned in said second line, thereby electrically separating the adjacent memory cell capacitors from each other.

9. A memory device according to claim 8, wherein said one electrode of said memory cell capacitor extends to a side wall of said bench to increase the capacitance o the memory cell capacitor.

10. A memory device according to claim 6, wherein one electrode of a capacitor of a memory cell to be connected to one bit line in a bit line pair extends below the other bit line of that bit line pair.

11. A memory device according to claim 10, wherein memory cells connected to respective non-adjacent bit lines in bit line pairs adjacent to each other in a word line direction each include a capacitor having one electrode extending below the other bit line in the respective bit line pair, and wherein a trench is provided between the respective extending one electrodes of the capacitors for electrical separation thereof.

12. In an isolation merged trench capacitor type semiconductor memory device with a folded bit line structure having a plurality of bit line paris of complementary bit liens (16a, 16b) wherein only one bit lien in a pair i connected to a selected memory cell connected to a selected word line, including a plurality of memory cells each comprising one transistor and one capacitor, each said memory cell comprising:

a transfer gate formed on a semiconductor substrate and including a fist impurity doped region (5a), a second impurity doped region (5b), and a channel region (11) formed between said first and second impurity doped regions (5a, 5b), said first impurity doped region electrically connected to a first bit line of a first bit line pair;

a thick insulating film (2) formed by selective oxidation of a surface of the substrate and provided along opposing ends of the channel region for preventing flow of leakage current in said memory cell from a storage node thereof to a bit line connected thereto;

a first capacitor ($C_F$) having a first electrode (5b) formed on the substrate surface, wherein said second impurity doped region comprises said first electrode;

said first capacitor including a first region overlapped by a second bit line o the first bit line pair, a second region overlapped by the firs t bit line o the first bit line pair and a third region connected with said fist and second regions, sad first region having a n end portion opposed to one end of said channel region a nd separated therefrom via said thick inuslating film, and said second region having an end portion contacting said thick insulating film formed on another end of the channel region;

a groove region (12) formed around said first capacitor excluding said end portion of said first region and said end potion of said second region, said groove region including a side wall having one electrode (5c) of a second capacitor ($C_P$) connected to said first electrode of said first capacitor, and a bottom wall having insulation film thereon (2) for isolating capacitors of adjacent memory cells;

said end portion of said second region being isolated by said thick insulating film from a corresponding end portion of a second region of a capacitor of an adjacent memory cell;

whereby only one bit line in said pair of bit lines is connected to a selected memory cell.

13. A semiconductor memory device in accordance with claim 12, each of said memory cells has an U shape.

14. A semiconductor memory device in accordance with claim 12, wherein said first impurity diffusion (5a) region is shared with a single adjacent memory cell, whereby two memory cells are oh connected to a single bit line through a contact hole (10).

15. A semiconductor memory device in accordance with claim 12, wherein said second capacitor ($C_P$) has a first electrode formed as part of said side wall 5c, a second electrode of said second capacitor ($C_P$) being formed to extend over and beyond said groove isolation region (12) so as to be shared with capacitors of an adjacent memory cell.

16. A semiconductor memory device in accordance with claim 12, wherein each of said memory cells further comprises a third capacitor ($C_S$), said third capacitor having a first electrode formed as part of a second electrode (3) of said first capacitor ($C_F$), the other electrode of said third capacitor being formed as part of a polysilicon layer (13) to extend over and beyond said second electrode (3) of said first capacitor so as to be shared with other memory cells of said semiconductor memory device.

* * * * *